United States Patent
Peng et al.

(10) Patent No.: US 12,046,444 B2
(45) Date of Patent: Jul. 23, 2024

(54) OBSERVATION CARRIER FOR MICROSCOPE

(71) Applicant: FlowVIEW Tek, Taipei (TW)

(72) Inventors: Po-Yang Peng, Taipei (TW);
Chun-Chieh Liang, Taipei (TW);
Liang-Hsun Lai, Taipei (TW);
Cheng-Yu Lee, Taipei (TW);
Hsin-Hung Lee, Taipei (TW)

(73) Assignee: FlowVIEW Tek, Taipei (TW)

( * ) Notice: Subject to any disclaimer, the term of this patent is extended or adjusted under 35 U.S.C. 154(b) by 459 days.

(21) Appl. No.: 17/501,999

(22) Filed: Oct. 14, 2021

(65) Prior Publication Data
US 2022/0148846 A1 May 12, 2022

Related U.S. Application Data

(60) Provisional application No. 63/113,173, filed on Nov. 12, 2020.

(30) Foreign Application Priority Data

Jun. 25, 2021 (TW) ................................ 110123382

(51) Int. Cl.
*H01J 37/20* (2006.01)
(52) U.S. Cl.
CPC ....... *H01J 37/20* (2013.01); *H01J 2237/2602* (2013.01)
(58) Field of Classification Search
CPC .................................. G02B 21/26; H01J 37/20
See application file for complete search history.

(56) References Cited

U.S. PATENT DOCUMENTS

| | | | |
|---|---|---|---|
| 5,414,556 A | 5/1995 | Focht | |
| 6,965,112 B2 * | 11/2005 | Moriya | H01J 37/20 250/442.11 |

(Continued)

FOREIGN PATENT DOCUMENTS

| | | |
|---|---|---|
| CN | 204613505 | 9/2015 |
| CN | 108735566 A * | 11/2018 |

(Continued)

OTHER PUBLICATIONS

"Notice of allowance of Japan Counterpart Application", issued on Sep. 30, 2022, p. 1-p. 3.

(Continued)

*Primary Examiner* — Christopher Stanford
(74) *Attorney, Agent, or Firm* — JCIP GLOBAL INC.

(57) ABSTRACT

An observation carrier includes a bottom base, a lower cover, an upper cover, and a rotation cover. The bottom has at least one first positioning portion. The lower cover has at least one second positioning portion, and at least one third positioning portion. The lower cover is detachably disposed on the bottom base and positioned with the first positioning portion through the second positioning portion. The upper cover has at least one fourth positioning portion and is detachably disposed on the bottom base. The upper cover is positioned with the third positioning portion through the fourth positioning portion. An observation region is formed between the upper cover and the lower cover. The rotation cover is detachably disposed on the bottom base to limit the upper and lower covers on the bottom base. The rotation cover is adapted to rotate to be locked or released by the bottom base.

10 Claims, 5 Drawing Sheets

(56) References Cited

U.S. PATENT DOCUMENTS

| | | | | |
|---|---|---|---|---|
| 7,230,242 | B2 * | 6/2007 | Behar | H01J 37/244 |
| | | | | 250/310 |
| 7,518,720 | B2 * | 4/2009 | Kolp | G01N 21/09 |
| | | | | 356/244 |
| 8,059,271 | B2 * | 11/2011 | Marsh | H01J 37/26 |
| | | | | 356/244 |
| 10,643,817 | B2 * | 5/2020 | Lee | H01J 37/20 |
| 11,221,283 | B2 * | 1/2022 | Bellaton | G01N 3/04 |
| 11,577,296 | B2 * | 2/2023 | Plancher | G01N 3/28 |
| 2020/0027695 | A1 | 1/2020 | Huang et al. | |
| 2022/0146806 | A1 * | 5/2022 | Peng | G02B 21/26 |

FOREIGN PATENT DOCUMENTS

| | | | | |
|---|---|---|---|---|
| CN | 110088661 | | 8/2019 | |
| CN | 209591971 | | 11/2019 | |
| DE | 69534447 T2 | * | 7/2006 | H01J 37/20 |
| JP | S60144899 | | 9/1985 | |
| JP | 2006030465 | | 2/2006 | |
| JP | 2007115666 A | * | 5/2007 | H01J 37/20 |
| JP | 2010060558 | | 3/2010 | |
| JP | 2011038923 | | 2/2011 | |
| JP | 2012175089 A | * | 9/2012 | H01L 29/2003 |
| JP | 2013061576 | | 4/2013 | |
| JP | 2017107125 | | 6/2017 | |
| JP | 2018200458 | | 12/2018 | |
| JP | 2020052383 | | 4/2020 | |
| KR | 960015319 | | 5/1996 | |
| KR | 20050089910 A | * | 9/2005 | |
| KR | 20100011686 A | * | 2/2010 | |
| WO | WO-2004021066 A1 | * | 3/2004 | C12M 23/48 |
| WO | WO-2008069355 A1 | * | 6/2008 | G02B 21/26 |
| WO | WO-2010009301 A1 | * | 1/2010 | G01N 35/1095 |
| WO | 2011118564 | | 9/2011 | |

OTHER PUBLICATIONS

"Office Action of China Counterpart Application", issued on Mar. 21, 2024, p. 1-p. 6.

* cited by examiner

OBSERVATION CARRIER FOR MICROSCOPE

CROSS-REFERENCE TO RELATED APPLICATION

This application claims the priority benefit of U.S. provisional application Ser. No. 63/113,173, filed on Nov. 12, 2020 and Taiwan application serial no. 110123382, filed on Jun. 25, 2021. The entirety of each of the above-mentioned patent application is hereby incorporated by reference herein and made a part of this specification.

BACKGROUND

Technology Field

The disclosure relates to an observation carrier, and particularly to an observation carrier for a microscope.

Description of Related Art

Optical microscopes and electron microscopes can be used to observe nanoscale samples, and the samples need to be carried on an observation stage for observation. The observation stage must at least include a bottom base and a cover, and the samples are placed in the observation region between the bottom base and the cover for observation. As far as the current observation stage is concerned, components such as the bottom base and the cover are mostly assembled by screw locks, and the current observation stage is not easy-to-use.

SUMMARY

The disclosure provides an observation carrier for a microscope, which is relatively easy-to-use.

The observation carrier for a microscope of the disclosure includes a bottom base, a lower cover, an upper cover, and a rotation cover. The bottom base has at least one first positioning portion. The lower cover has at least one second positioning portion and at least one third positioning portion. The lower cover is detachably disposed on the bottom base and is positioned with the first positioning portion through the second positioning portion. The upper cover has at least one fourth positioning portion. The upper cover is detachably disposed on the bottom base such that the lower cover is located between the bottom base and the upper cover. The upper cover is positioned with the third positioning portion through the fourth positioning portion. An observation region is formed between the upper cover and the lower cover, and the observation region is adapted to carry a sample. The rotation cover is detachably disposed on the bottom base to limit the upper cover and the lower cover on the bottom base, and the rotation cover is adapted to rotate relative to the bottom base to be locked by the bottom base or to be released by the bottom base.

In an embodiment of the disclosure, the rotation cover is adapted to rotate relative to the bottom base along a rotation axis, and the at least one first positioning portion and the at least one second positioning portion are mutually positioned to prevent the lower cover from rotating relative to the bottom base along the rotation axis.

In an embodiment of the disclosure, the rotation cover is adapted to rotate relative to the bottom base along a rotation axis, and the at least one third positioning portion and the at least one fourth positioning portion are mutually positioned to prevent the upper cover from rotating relative to the lower cover along the rotation axis.

In an embodiment of the disclosure, one of the at least one first positioning portion and the at least one second positioning portion is protruding, and the other of the at least one first positioning portion and the at least one second positioning portion is concave.

In an embodiment of the disclosure, one of the at least one third positioning portion and the at least one fourth positioning portion is protruding, and the other of the at least one third positioning portion and the at least one fourth positioning portion is concave.

In an embodiment of the disclosure, the lower cover has a first window, the upper cover has a second window, and the observation region is formed between the first window and the second window.

In an embodiment of the disclosure, the observation carrier for a microscope includes a first sealing ring and a second sealing ring. The first sealing ring is disposed between the bottom base and the lower cover and surrounds the observation region, and the second sealing ring is disposed between the bottom base and the upper cover and surrounds the observation region.

In an embodiment of the disclosure, the bottom base has an accommodating space, and the accommodating space is adapted to accommodate the lower cover, the upper cover, and the rotation cover.

In an embodiment of the disclosure, an inner edge of the accommodating space has an annular groove, a periphery of the rotation cover has at least one protrusion, and the at least one protrusion is adapted to extend into the annular groove to prevent the rotation cover from being separated from the bottom base.

In an embodiment of the disclosure, a top surface of the bottom base has at least one notch, the at least one notch communicates with the annular groove, and the at least one protrusion is adapted to correspond to the at least one notch as the rotation cover rotates.

In summary, in the observation carrier for a microscope of the disclosure, the upper cover and the lower cover are position-limited on the bottom base by the rotation cover, and the rotation cover is locked or separated from the bottom base by its own rotation. Accordingly, the disassembly and assembly of the bottom base, the upper cover, the lower cover, and the rotation cover can be completed only by rotating the rotation cover, and no screw locks are required in disassembling and assembling, so the observation carrier for a microscope is relatively easy-to-use. Moreover, the bottom base and the lower cover are mutually positioned through the first positioning structure and the second positioning structure, and the lower cover and the upper cover are mutually positioned through the third positioning structure and the fourth positioning structure, so the rotation cover can be prevented from driving the lower cover and/or the upper cover to rotate unexpectedly during the rotation.

DESCRIPTION OF THE EMBODIMENTS

Figure 1:
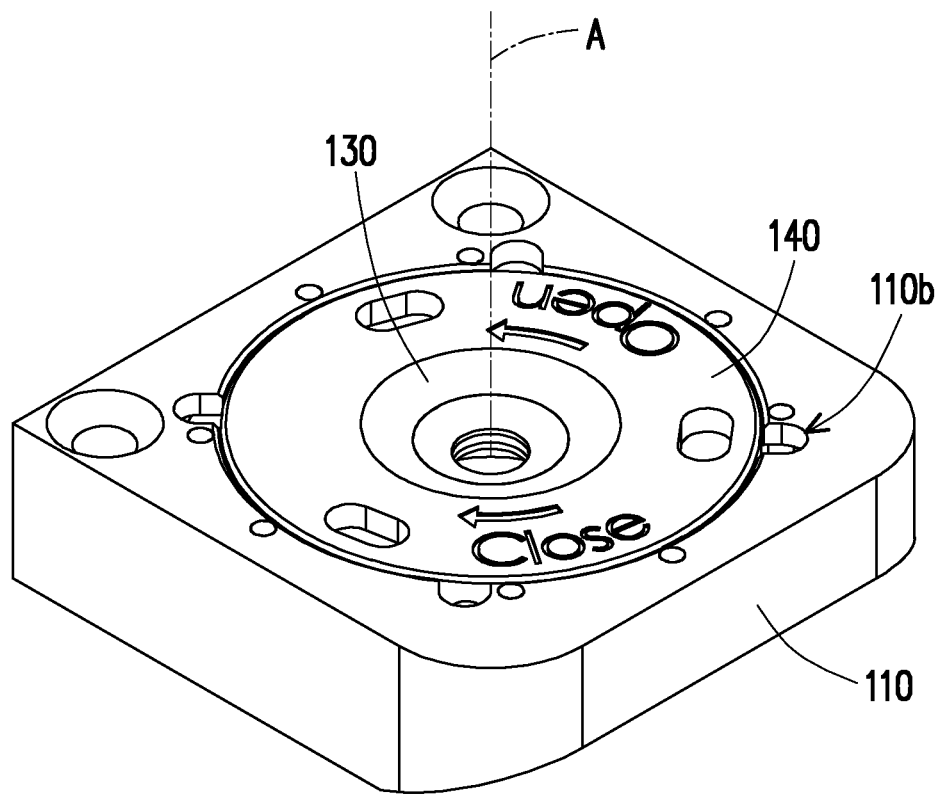
FIG. 1 is a perspective view of an observation carrier for a microscope according to an embodiment of the disclosure.
Figure 2:
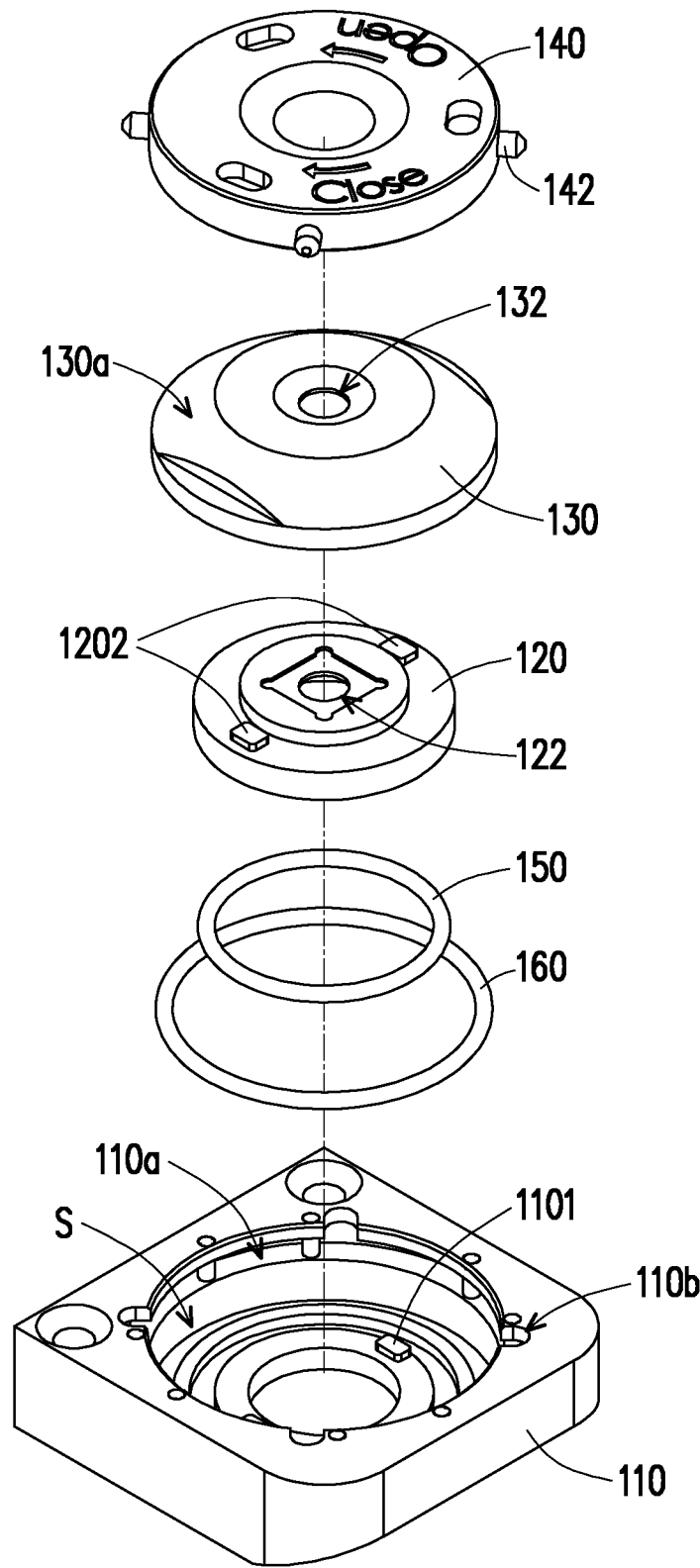
FIG. 2 is an exploded view of the observation carrier for a microscope of FIG. 1.
Figure 3:
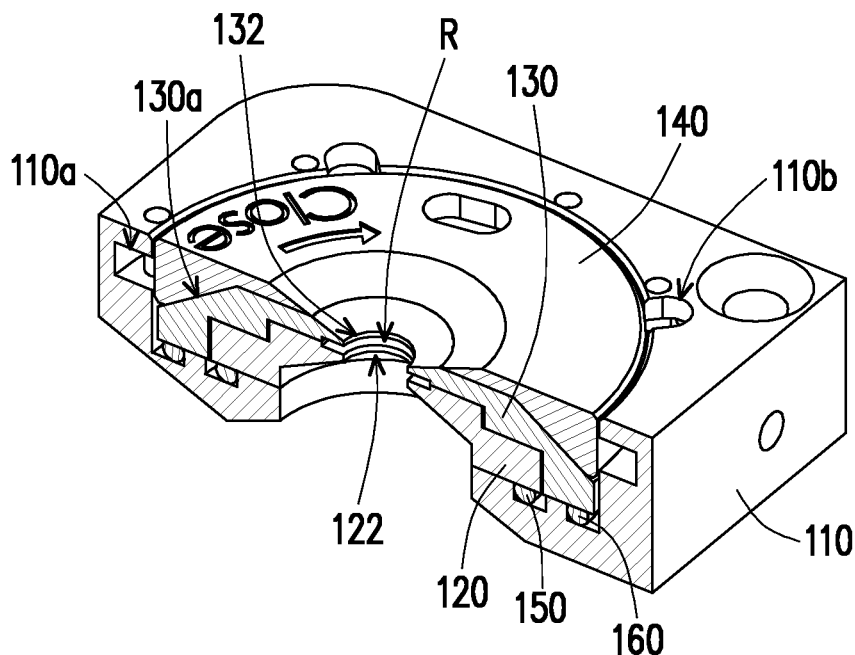
FIG. 3 is a perspective view of a partial structure of the observation carrier for a microscope of FIG. 1.
Figure 4:
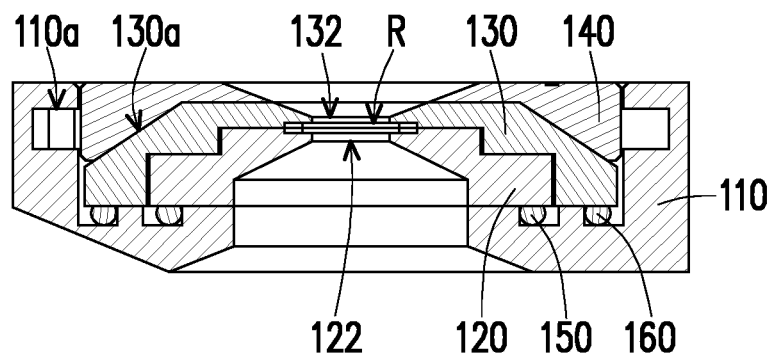
FIG. 4 is a side view of the observation carrier for a microscope of FIG. 3.

FIG. 1 is a perspective view of an observation carrier for a microscope according to an embodiment of the disclosure. FIG. 2 is an exploded view of the observation carrier for a microscope of FIG. 1. FIG. 3 is a perspective view of a partial structure of the observation carrier for a microscope of FIG. 1. FIG. 4 is a side view of the observation carrier for a microscope of FIG. 3. Referring to FIG. 1 to FIG. 4, in the embodiment, an observation carrier 100 for a microscope includes a bottom base 110, a lower cover 120, and an upper cover 130. The lower cover 120 is detachably disposed on the bottom base 110, and the upper cover 130 is detachably disposed on the bottom base 110 such that the lower cover 120 is located between the bottom base 110 and the upper cover 130. An observation region R is formed between the upper cover 130 and the lower cover 120. The observation region R is adapted to carry a sample, and the microscope can observe the sample in the observation region R. In the disclosure, the shape of the bottom base 110 is not limited thereto. In addition to the shape shown in FIG. 1 and FIG. 2, the bottom base 110 may also have other shapes to match different types or models of microscopes according to requirements.

In the disclosure, the observation mode of the sample carried by the observation region R is not limited, and the mode can be either a non-dynamic observation mode or a dynamic observation mode in which liquid flows in the observation region R. In the dynamic observation mode, an appropriate flow channel can be added to the observation carrier 100 for a microscope for the liquid to flow through the observation region R. For example, the liquid is used to take away the metabolites of the sample or served as a medium for adding the reagents required for measurement to the sample.

In the embodiment, the lower cover 120 has a first window 122, and the upper cover 130 has a second window 132. A microfluidic chamber between the first window 122 and the second window 132 forms the observation region R. A reflective microscopic observation can be performed through the second window 132, or a transmission microscopic observation can be performed through the second window 132 and the first window 122, which is not limited in the disclosure. Specifically, the first window 122 and the second window 132 respectively include a thin film (e.g., a silicon nitride thin film). For an observation of an electron microscope, the thin film is transparent to electrons of a specific energy, and the electron beam of the electron microscope can pass through the first window 122 and the second window 132.

In the embodiment, the observation carrier 100 for a microscope further includes a rotation cover 140. The rotation cover 140 is detachably disposed on the bottom base 110 to limit the upper cover 130 and the lower cover 120 on the bottom base 110, and the rotation cover 140 can rotate relative to the bottom base 110 along a rotation axis A (as shown in FIG. 1) to be locked by the bottom base 110 or released by the bottom base 110. Accordingly, the bottom base 110, the upper cover 130, the lower cover 120, and the rotation cover 140 can be disassembled and assembled only by rotating the rotation cover 140, and no screw locks are required in disassembling and assembling. Therefore, the observation carrier 100 for a microscope is relatively easy-to-use. The method for disassembling and assembling the rotation cover 140 is illustrated in details in the following paragraphs.

Figure 5:
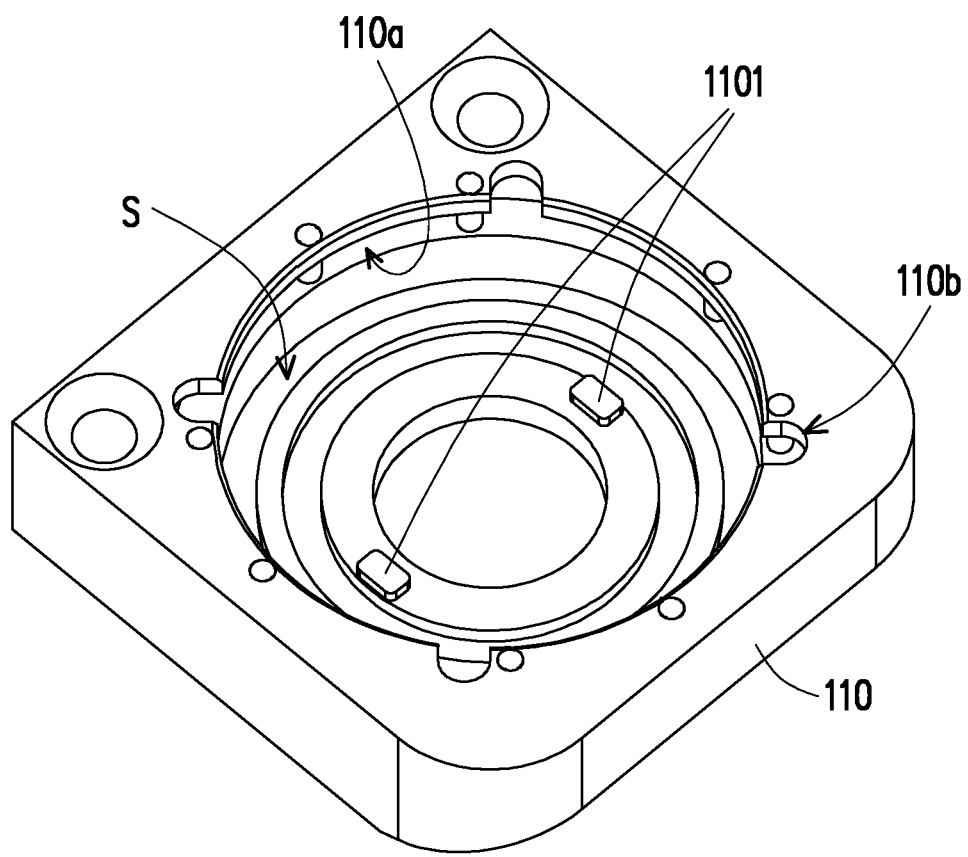
FIG. 5 is a perspective view of the bottom base of FIG. 1.

In the embodiment, the bottom base 110 has an accommodating space S (as shown in FIG. 2 and FIG. 5), and the accommodating space S is adapted to accommodate the lower cover 120, the upper cover 130, and the rotation cover 140. Moreover, as shown in FIG. 2 to FIG. 5, the inner edge of the accommodating space S of the bottom base 110 has an annular groove 110*a*. Correspondingly, the periphery of the rotation cover 140 has at least one protrusion 142 (a plurality of which are shown in FIG. 2), and the protrusion 142 is adapted to extend into the annular groove 110*a* to prevent the rotation cover 140 from being separated from the bottom base 110. Moreover, the top surface of the bottom base 110 has at least one notch 110*b* (a plurality of which are shown in FIG. 1, FIG. 3, FIG. 4, and FIG. 5), and the notch 110*b* communicates with the annular groove 110*a*. The protrusions 142 of the rotation cover 140 can correspond to the notches 110*b*, respectively as the rotation cover 140 rotates, each of the protrusions 142 can move away from the annular groove 110*a* through the corresponding notch 110*b*, and the rotation cover 140 can be disassembled.

Figure 6:
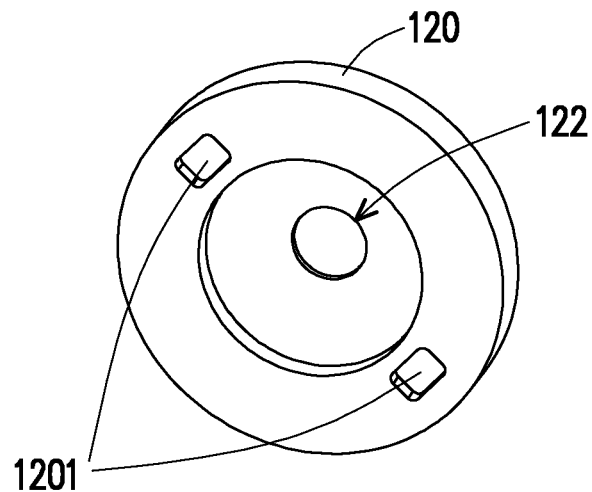
FIG. 6 is a perspective view of the lower cover of FIG. 2.
Figure 7:
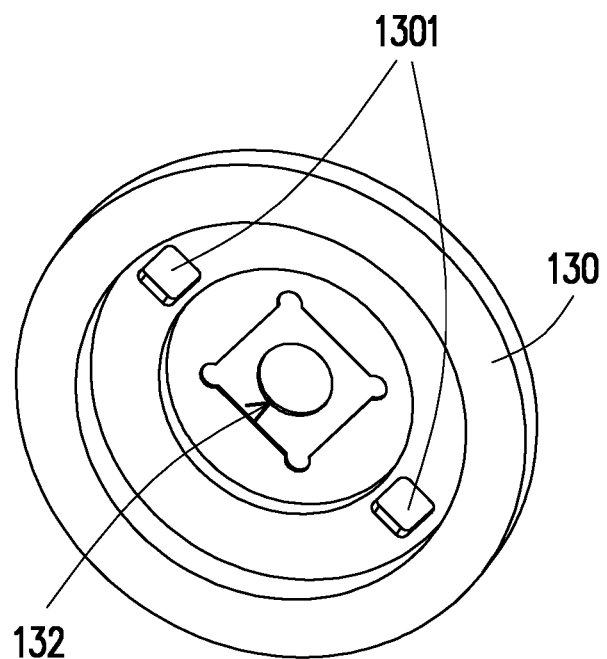
FIG. 7 is a perspective view of the upper cover of FIG. 1.

FIG. 5 is a perspective view of the bottom base of FIG. 1. FIG. 6 is a perspective view of the lower cover of FIG. 2. FIG. 7 is a perspective view of the upper cover of FIG. 1. Referring to FIG. 2 and FIG. 5 to FIG. 7, in the embodiment, the bottom base 110 has at least one first positioning portion 1101 (two first positioning portions are shown), the lower cover 120 has at least one second positioning portion 1201 (two second positioning portions are shown) and at least one third positioning portion 1202 (two third positioning portions are shown), and the upper cover 130 has at least one fourth positioning portion 1301 (two fourth positioning portions are shown). The lower cover 120 is positioned with the first positioning portion 1101 of the bottom base 110 through the second positioning portion 1201, so the lower cover 120 is prevented from rotating relative to the bottom base 110 along the rotation axis A through the mutual positioning of the first positioning portion 1101 and the second positioning portion 1201; and the upper cover 130 is positioned with the third positioning portion 1202 of the lower cover 120 through the fourth positioning portion 1301, so the upper cover 130 is prevented from rotating relative to the lower cover 120 along the rotation axis A through the mutual positioning of the third positioning portion 1202 and the fourth positioning portion 1301. Accordingly, the rotation cover 140 can be prevented from driving the lower cover 120 and/or the upper cover 130 to rotate unexpectedly during the rotation.

In the embodiment, for example, the first positioning portion 1101 and the third positioning portion 1202 are protruding, and the second positioning portion 1201 and the fourth positioning portion 1301 are concave correspondingly. In other embodiments, the first positioning portion 1101 and the third positioning portion 1202 may be concave, and the second positioning portion 1201 and the fourth positioning portion 1301 are protruding correspondingly. The disclosure does not limit the specific form of each positioning portion.

Referring to FIG. 2 to FIG. 4, in the embodiment, the observation carrier 100 for a microscope further includes a first sealing ring 150 and a second sealing ring 160. The first sealing ring 150 is disposed between the bottom base 110 and the lower cover 120 and surrounds the observation region R, and the second sealing ring 160 is disposed between the bottom base 110 and the upper cover 130 and surrounds the observation region R. For example, the first sealing ring 150 and the second sealing ring 160 are rubber rings or other elastic sealing materials to isolate the observation region R from the outside to facilitate observation. Furthermore, when the rotation cover 140 is rotated along the rotation axis A and pressed down and locked to the bottom base 110, an average pressing force can be generated simultaneously, so the first sealing ring 150 in contact with the bottom base 110 and the lower cover 120 and the second sealing ring 160 in contact with the bottom base 110 and the upper cover 130 produce a sealing effect to isolate the sample to be tested in the observation region R from the outside. Moreover, the first sealing ring 150 and the second sealing ring 160 also have a function of buffering the pressing force.

As shown in FIG. 4, the upper cover 130 is configured to completely cover the lower cover 120, and the outer periphery of the upper cover 130 has a slope 130a to increase the configuration room for the rotation cover 140, and therefore the overall structure thickness is effectively reduced. In other embodiments, the lower cover 120, the upper cover 130, and the rotation cover 140 may have other suitable shapes, and the disclosure is not limited thereto.

In summary, in the observation carrier for a microscope of the disclosure, the upper cover and the lower cover are position-limited on the bottom base by the rotation cover, and the rotation cover is locked or separated from the bottom base by its own rotation. Accordingly, the disassembly and assembly of the bottom base, the upper cover, the lower cover, and the rotation cover can be completed only by rotating the rotation cover, and no screw locks are required in disassembling and assembling, so the observation carrier for a microscope is relatively easy-to-use. Moreover, the bottom base and the lower cover are mutually positioned through the first positioning structure and the second positioning structure, and the lower cover and the upper cover are mutually positioned through the third positioning structure and the fourth positioning structure, so the rotation cover can be prevented from driving the lower cover and/or the upper cover to rotate unexpectedly during the rotation.

What is claimed is:

1. A observation carrier for a microscope, comprising:
   a bottom base comprising at least one first positioning portion;
   a lower cover comprising at least one second positioning portion and at least one third positioning portion, wherein the lower cover is detachably disposed on the bottom base and is positioned with the at least one first positioning portion through the at least one second positioning portion;
   an upper cover comprising at least one fourth positioning portion, wherein the upper cover is detachably disposed on the bottom base such that the lower cover is located between the bottom base and the upper cover, the upper cover is positioned with the at least one third positioning portion through the at least one fourth positioning portion, an observation region is formed between the upper cover and the lower cover, and the observation region is adapted to carry a sample; and
   a rotation cover detachably disposed on the bottom base to limit the upper cover and the lower cover on the bottom base, wherein the rotation cover is adapted to rotate relative to the bottom base to be locked by the bottom base or to be released by the bottom base.

2. The observation carrier for a microscope according to claim 1, wherein the rotation cover is adapted to rotate relative to the bottom base along a rotation axis, and the at least one first positioning portion and the at least one second positioning portion are mutually positioned to prevent the lower cover from rotating relative to the bottom base along the rotation axis.

3. The observation carrier for a microscope according to claim 1, wherein the rotation cover is adapted to rotate relative to the bottom base along a rotation axis, and the at least one third positioning portion and the at least one fourth positioning portion are mutually positioned to prevent the upper cover from rotating relative to the lower cover along the rotation axis.

4. The observation carrier for a microscope according to claim 1, wherein one of the at least one first positioning portion and the at least one second positioning portion is protruding, and the other of the at least one first positioning portion and the at least one second positioning portion is concave.

5. The observation carrier for a microscope according to claim 1, wherein one of the at least one third positioning portion and the at least one fourth positioning portion is protruding, and the other of the at least one third positioning portion and the at least one fourth positioning portion is concave.

6. The observation carrier for a microscope according to claim 1, wherein the lower cover comprises a first window, the upper cover comprises a second window, and the observation region is formed between the first window and the second window.

7. The observation carrier for a microscope according to claim 1, comprising a first sealing ring and a second sealing ring, wherein the first sealing ring is disposed between the bottom base and the lower cover and surrounds the observation region, and the second sealing ring is disposed between the bottom base and the upper cover and surrounds the observation region.

8. The observation carrier for a microscope according to claim 1, wherein the bottom base comprises an accommodating space, and the accommodating space is adapted to accommodate the lower cover, the upper cover, and the rotation cover.

9. The observation carrier for a microscope according to claim 8, wherein an inner edge of the accommodating space comprises an annular groove, a periphery of the rotation cover comprises at least one protrusion, and the at least one protrusion is adapted to extend into the annular groove to prevent the rotation cover from being separated from the bottom base.

10. The observation carrier for a microscope according to claim 9, wherein a top surface of the bottom base comprises at least one notch, the at least one notch communicates with the annular groove, and the at least one protrusion is adapted to correspond to the at least one notch as the rotation cover rotates.

* * * * *